(12) United States Patent
Wang

(10) Patent No.: US 12,308,797 B2
(45) Date of Patent: May 20, 2025

(54) FILTER COMBINER FOR A DOHERTY AMPLIFIER, AND A DOHERTY AMPLIFIER

(71) Applicant: Syntronic AB, Gävle (SE)

(72) Inventor: Zhancang Wang, Beijing (CN)

(73) Assignee: Syntronic AB, Gavle (SE)

( * ) Notice: Subject to any disclaimer, the term of this patent is extended or adjusted under 35 U.S.C. 154(b) by 476 days.

(21) Appl. No.: 17/512,225

(22) Filed: Oct. 27, 2021

(65) Prior Publication Data

US 2022/0140789 A1 May 5, 2022

(30) Foreign Application Priority Data

Nov. 3, 2020 (CN) .......................... 202011207580.3

(51) Int. Cl.
  *H03F 1/02* (2006.01)
  *H03F 1/56* (2006.01)
  *H03H 7/01* (2006.01)

(52) U.S. Cl.
  CPC ........... *H03F 1/0288* (2013.01); *H03F 1/565* (2013.01); *H03H 7/0123* (2013.01); *H03F 2200/168* (2013.01)

(58) Field of Classification Search
  CPC .. H03F 1/0288; H03F 1/565; H03F 2200/168; H03F 2200/171;

(Continued)

(56) References Cited

U.S. PATENT DOCUMENTS

| 9,071,211 | B1 | 6/2015 | Ozard | |
| 9,577,585 | B2 * | 2/2017 | Moronval | ............. H03F 1/0288 |
| 2012/0200370 | A1 | 8/2012 | Wright | |

FOREIGN PATENT DOCUMENTS

WO 2019119262 A1 6/2019

OTHER PUBLICATIONS

Hou, Zhang Ju et al., "High-frequency wideband quadrature coupler using transformer and lumped elements", Electronic Letters, pp. 1954-1955, vol. 50, No. 25, (2014).

* cited by examiner

*Primary Examiner* — Andrea Lindgren Baltzell
*Assistant Examiner* — Khiem D Nguyen
(74) *Attorney, Agent, or Firm* — Renner, Otto, Boisselle & Sklar, LLP.

(57) ABSTRACT

A filter combiner for a Doherty amplifier includes a first port with an impedance of Z0 configured to be connected to an output of a carrier amplifier; a second port with an impedance of $Z0 \cdot r/(1+r)$ configured to be connected to a load; a third port with an impedance of $Z0 \cdot r/(1+r)$ configured to be connected to a peak amplifier, wherein r is a power ratio for the carrier amplifier to the peak amplifier; and a fourth port with an impedance of Z0 configured to be connected to an output port of the Doherty amplifier. The first port is connected to the second port via a first network that is a lowpass filter and to the third port via a second network that is a lowpass filter which is configured to operate as a band stop filter upon loading the input or the output of the second network with a high impedance when the peak amplifier is off. The third port is connected to the fourth port via a third network that is a lowpass filter configured to operate as a band stop filter upon loading the input or the output of the second network with a high impedance when the peak amplifier is off. The fourth port is connected to the second port via a fourth network that is a lowpass filter.

3 Claims, 2 Drawing Sheets

(58) Field of Classification Search
CPC ............... H03F 2200/391; H03F 3/19; H03F 2200/451; H03F 1/07; H03F 1/56; H03H 7/0123; H03H 7/48; H03H 7/0115
USPC ........................................................ 330/295
See application file for complete search history.

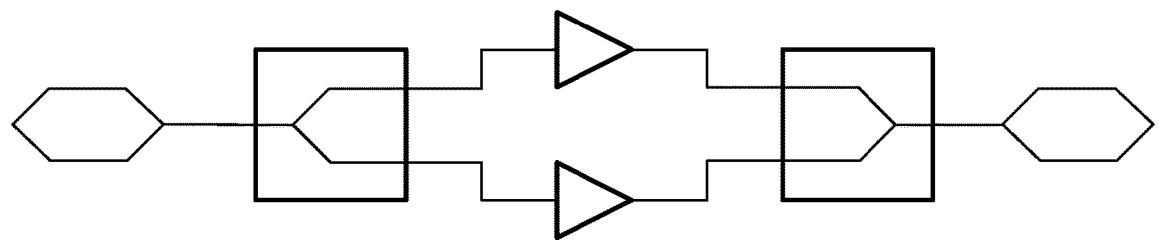
FIG. 1 Prior-Art
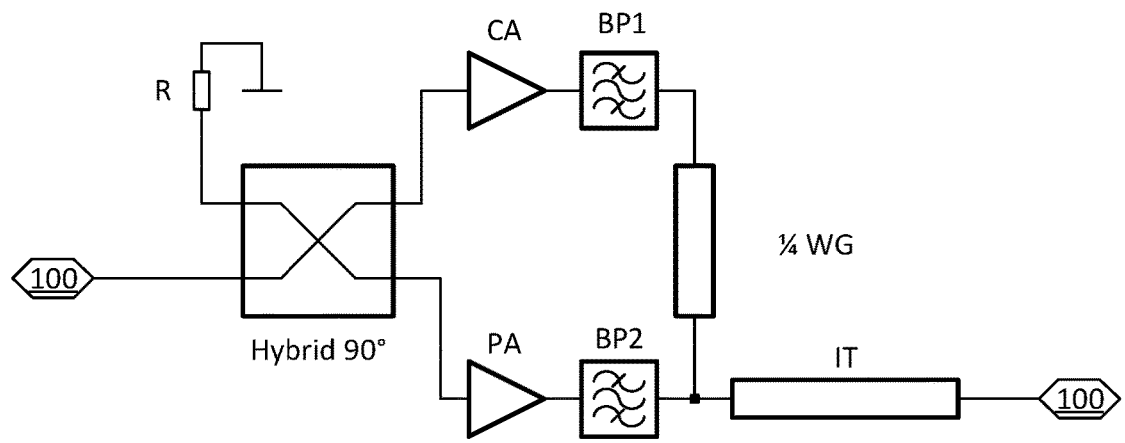
FIG. 2 Prior-Art
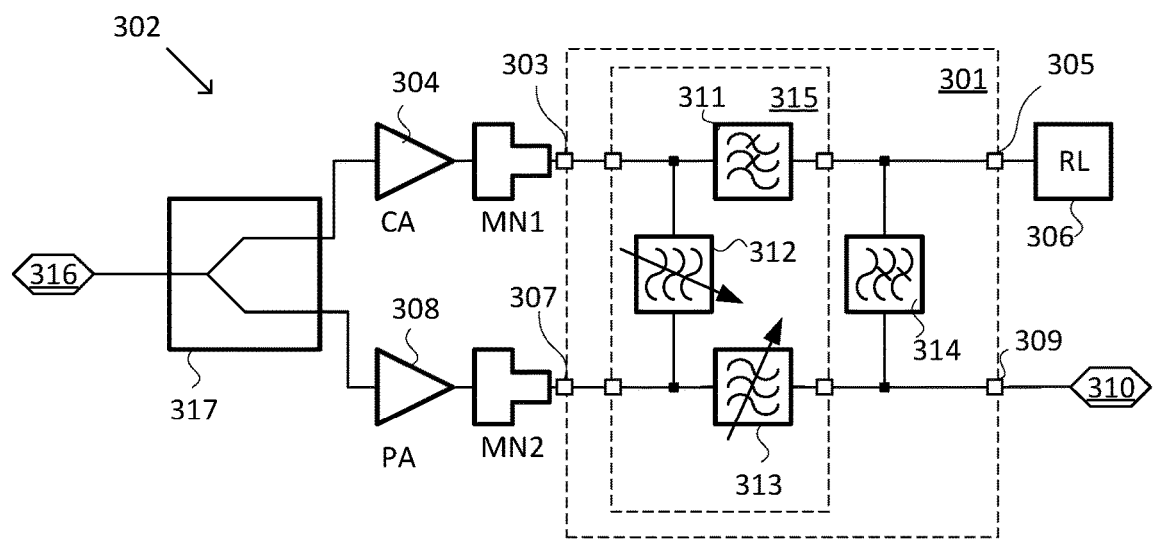
FIG. 3

FILTER COMBINER FOR A DOHERTY AMPLIFIER, AND A DOHERTY AMPLIFIER

This application claims priority of Chinese Application No. 202011207580.3, filed Nov. 3, 2020, the disclosure of which is hereby incorporated by reference.

TECHNICAL FIELD

The present invention relates to a combiner for a Doherty amplifier, more particularly to a filter combiner for a Doherty amplifier and to a Doherty amplifier.

BACKGROUND

The Doherty amplifier design is a very important amplifier design today and is used in many different applications. But maybe the most important use is within mobile communication for amplification in the RF output stage. The basic idea of the Doherty amplifier is to combine a carrier amplifier with a peak amplifier, which is used for peak power, see FIG. 1. The Doherty amplifier power-combines two (and recently, more) amplifiers, one is called the "carrier" amplifier while the second is called the "peaking" amplified. In many Doherty amplifiers the two amplifiers are biased differently, the carrier amplifier is operating at a normal Class AB (provides gain at any power level) or Class B, while the peaking amplifier is operating at Class C which only conducts at half of the cycle. The Doherty amplifier provides a number of beneficial properties, such as improved power-added efficiency, compared to a balanced amplifier, at backed off power levels.

The Doherty amplifier pair works as follows: on the input the signal is split using a quadrature coupler, which may not necessarily be an equal split. The input behaves the same as a balanced amplifier, and has the same feature where mismatched amplifiers will have their reflection coefficients reduced if the reflection coefficients are equal in amplitude and phase, the reflected waves end up in the load terminating the isolated port of the coupler.

At the output of the Doherty pair, The two signals are out of phase by 90 degrees, but by the addition of a quarter-wave transmission line of the peaking amplifier, they are brought back into phase and reactively combined. At this point the two signals in parallel create a $Z_0/2$ impedance. This is stepped up to $Z_0$ by a quarter-wave transformer. However, the amplifiers are operating non-linearly, which means that the output combiner becomes more complicated. During operation, the response of one amplifier actively load-pulls the other. In order to dimension and design a Doherty amplifier it is necessary to perform nonlinear analyses.

In the combiner the signals from the peaking amplifier and from the carrier amplifier are brought back into phase and reactively combined. This often requires a quarter-wave transmission line and other sections of transmission lines, see FIG. 2 and these transmission lines may be large and bulky if the frequency for operation is low. Furthermore, this solution may be narrow banded due to the use of transmission lines.

It is therefore an object of the present invention to provide a combiner that reduces the use of transmission lines for its operation.

In the art several attempts have been made to design such a combiner with various degree of success. In the following such a known attempt will be discussed.

In U.S. Pat. No. 9,071,211B1 an output combiner is disclosed. However, this solution uses transmission lines for the main amplifier and for the peaking amplifier which may result in a design that is hard to integrate due to the physical size of the transmission lines if lower frequencies are used. This combiner utilizes a combination of lumped elements such as inductors, capacitors and transmission lines in order to achieve the desired reactive coupling.

Thus, there are still room for improvements in order to achieve an improved Doherty combiner that is small and efficient.

SUMMARY

According to the present invention, the above-mentioned object is achieved by means of a filter combiner having the features defined in claim 1.

The filter combiner for a Doherty amplifier according to the present invention comprises a first port with an impedance of $Z_0$ configured to be connected to an output of a carrier amplifier, a second port with an impedance of $Z_0 \cdot r/(1+r)$ configured to be connected to a load, a third port with an impedance of $Z_0 \cdot r/(1+r)$ configured to be connected to a peak amplifier, wherein r is a power ratio for the carrier amplifier to the peaking amplifier. The filter combiner further comprises a fourth port with an impedance of $Z_0$ configured to be connected to an output port of the Doherty amplifier. The first port is connected to the second port via a first network, wherein the first network is a low-pass filter. The first port is connected to the third port via a second network, wherein the second network is a low-pass filter which is configured to operate as a band stop filter upon loading the input or the output of the second network with a high impedance when the peak amplifier is off. The third port is connected to the fourth port via a third network, wherein the third network is a lowpass filter configured to operate as a band stop filter upon loading the input or the output of the second network with a high impedance when the peak amplifier is off. The fourth port is connected to the second port via a fourth network, wherein the fourth network is a lowpass filter.

According to one embodiment, the first network, the second network, the third network, and the fourth network only comprises lumped elements. This way the Doherty combiner becomes small with a reduced number of bulky transmission line segments. Furthermore, this allows a more broadband capable combiner.

According to one embodiment, the high impedance is above 500 ohm.

According to one embodiment, the first, second, third, and the fourth network are π-type, and/or T-type, low-pass filters.

According to one embodiment, the first network, the second network, the third network, and the fourth network are symmetrical networks.

According to one embodiment, the first network, second network and the third network forms a first branch, and wherein the filter combiner comprises at least one further first branch cascade coupled to the first branch and to the fourth port of the filter combiner and to the second port of the filter combiner via said fourth network. This way a broadband Doherty combiner may be designed.

The present invention also relates to a Doherty amplifier for telecommunication, comprising an input port, a splitter with an input connected to the input port, a carrier amplifier with an input connected to an output of the splitter. The Doherty amplifier further comprises a peak amplifier with an input connected to an output of the splitter with a phase delay. The Doherty amplifier further comprises a filter combiner according to any embodiments disclosed herein, and a first port of the filter combiner is connected to an output of the carrier amplifier, and a third port of the filter combiner is connected to an output of the peak amplifier. Furthermore, a load is connected to a second port of the filter combiner, and an output port is connected to a fourth port of the filter combiner.

Further advantages of the present invention will appear from the description following below.

LIST OF DRAWINGS

Embodiments of the invention will now be described in detail with regard to the annexed drawings, in which:

FIG. 1 is a schematic block diagram of a prior-art Doherty amplifier,

FIG. 2 is schematic block diagram of a prior-art Doherty amplifier,

Figure 4:
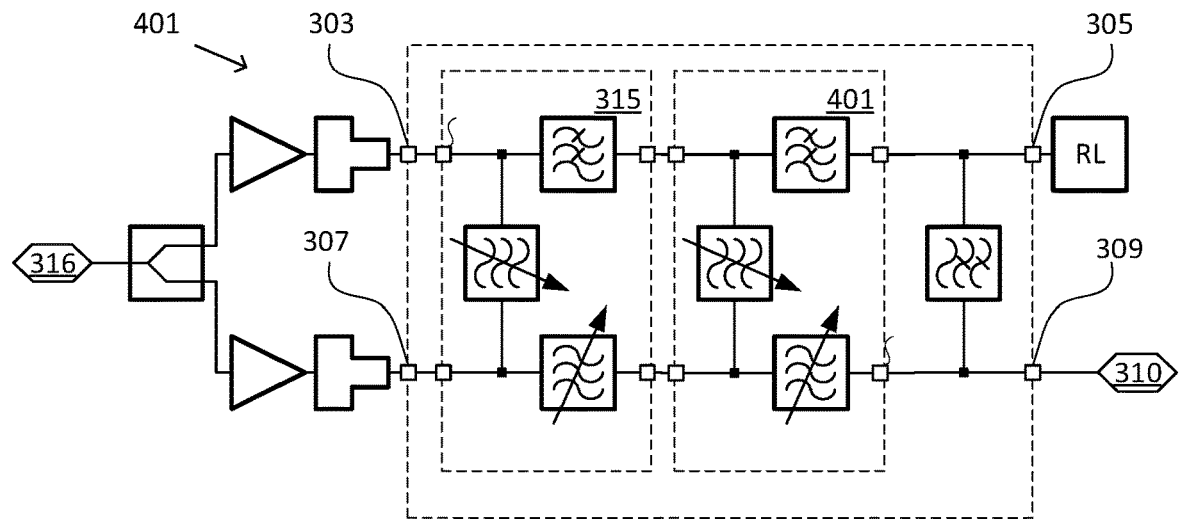
Figure 5:
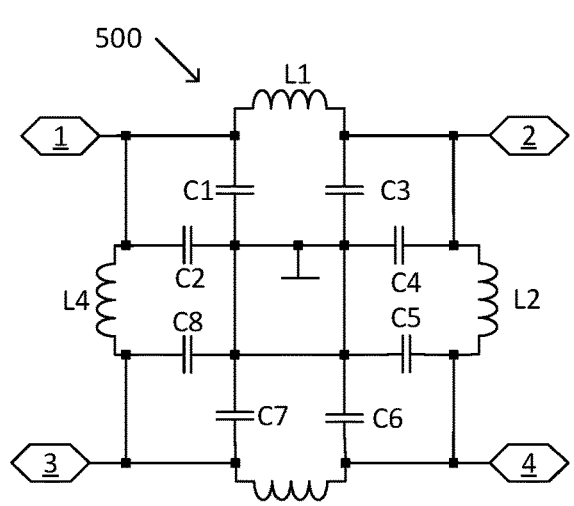
Figure 6:
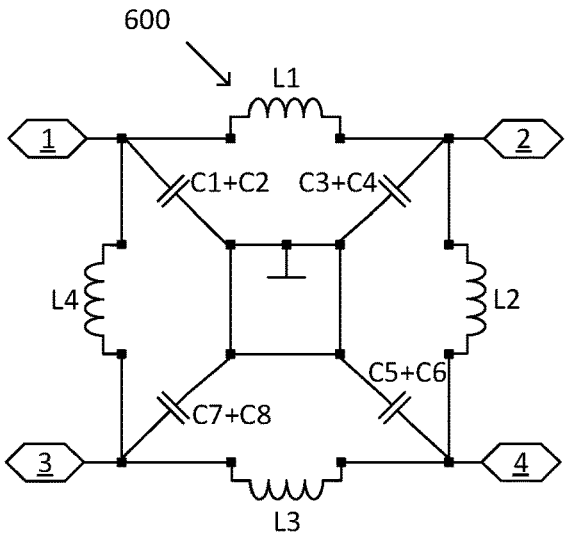
Figure 7:
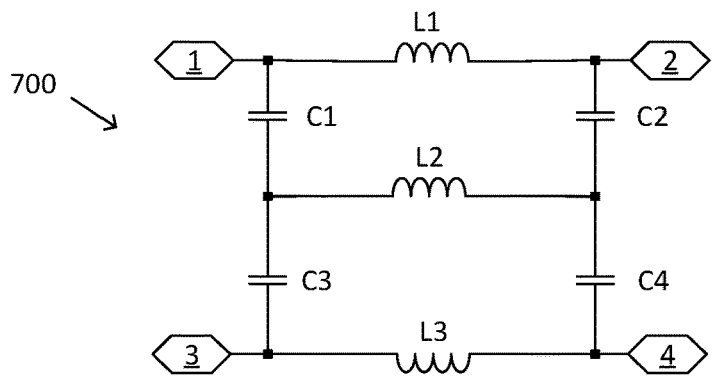

FIG. 3 is a schematic block diagram of a Doherty amplifier with a combiner according to an embodiment of the present invention, FIG. 4 is a schematic block diagram of a Doherty amplifier with a combiner according to an embodiment of the present invention, FIG. 5 is circuit diagram for a combiner according to an embodiment of the present invention, FIG. 6 is circuit diagram for a combiner according to an embodiment of the present invention, and FIG. 7 is circuit diagram for a combiner according to an embodiment of the present invention.

DETAILED DESCRIPTION OF EMBODIMENTS

Reference is now made to FIG. 3 which shows a Doherty amplifier for telecommunication, generally designated 302. The Doherty amplifier 302 for telecommunication, comprises an input port 316; a splitter 317 with an input connected to the input port 316; a carrier amplifier 304 with an input connected to an output of the splitter 317; a peak amplifier 308 with an input connected to an output of the splitter with a phase delay. The Doherty combiner 302 further comprises a filter combiner 301 described herein below, wherein a first port 303 of the filter combiner 301 is connected to an output of the carrier amplifier 304, and a third port 307 of the filter combiner 301 is connected to an output of the peak amplifier 308; and a load 306 is connected to a second port 305 of the filter combiner 301; and an output port 310 connected to a fourth port 309 of the filter combiner 301.

The filter combiner 301 comprises: a first port 303 with an impedance of $Z_0$ configured to be connected to an output of a carrier amplifier 304, a second port 305 with an impedance of $Z_0 \cdot r/(1+r)$ configured to be connected to a load 306, a third port 307 with an impedance of $Z_0 \cdot r/(1+r)$ configured to be connected to a peak amplifier 308, wherein r is a power ratio for the carrier amplifier to the peaking amplifier; a fourth port 309 with an impedance of $Z_0$ configured to be connected to an output port 310 of the Doherty amplifier 302. The first port is connected to the second port via a first network 311. The first network is a lowpass filter. The first port is connected to the third port via a second network 312. The second network is a lowpass filter which is configured to operate as a band stop filter upon loading the input or the output of the second network with a high impedance when the peak amplifier is off. The third port is connected to the fourth port via a third network 313. The third network is a lowpass filter configured to operate as a band stop filter upon loading the input or the output of the second network with a high impedance when the peak amplifier is off. The fourth port is connected to the second port via a fourth network 314. The fourth network is a lowpass filter.

RF design and especially microwave design used to be an art that relied heavily upon experience and manual tuning with ferrite blocks and carving the PCB with an utility knife. This manual work has today been replaced to a large extent with numerical simulations that incorporates both electromagnetic field simulations and circuit simulations. An important tool of such simulation packages is the optimizer in which a goal is set by the operator and the simulator adapts the circuit to achieve the goal.

The design of a filter combiner according to the present invention relies heavily upon the use of such an optimizer and the process of designing such a combiner will be outlined herein.

Now with reference made to FIG. 3 a design process of the inventive filter combiner will be outlined. The filter combiner of the present invention may be designed by following the steps below:

a) Design a traditional Doherty amplifier with the following impedances:
   First port 303 with the impedance of $Z_0$.
   Second port 305 start with an initial reactive load value for the load 306.
   Third port 307 with an impedance of $Z_0 \cdot r/(1+r)$.
   Fourth port 309 with an impedance of $Z_0$.

b) Fix the impedance values for the first port 303, the third port 307, and for the fourth port 309. Set up variables for the first network 311, second network 312, third network 313, and the fourth network 314. The variables may be the component values for the passive components of respective network as well as fixed Q values and a fixed operation frequency. Set up optimization goals which may be expressed as small signal S-parameters, and phase shift and group delay.

c) Select a proper optimization strategy and perform the optimization such that the error between the goal and the current design is minimized.

d) When the optimization goals are achieved the filter combiner design is fixed.

e) Fine tune the load 306 until the designed Doherty amplifier has acceptable performance.

FIG. 4 shows a cascade coupled filter combiner according to an embodiment of the present invention in which the first network, second network and the third network forms a first branch (315), and wherein the filter combiner comprises at least one further first branch (401) cascade coupled to the first branch (315) and to the fourth port (309) of the filter combiner and to the second port (305) of the filter combiner via said fourth network (314).

Now with reference made to FIG. 3 again, first network 311, the second network 312, the third network 313, and the fourth network 314 only comprises lumped elements. The first network 311, second network 312, third network 313, and the fourth network 314 are π-type, and/or T-type, low pass filters. Furthermore, the first network 311, the second network 312, the third network 313, and the fourth network 314 are symmetrical networks. This is illustrated in FIG. 5 which shows a filter combiner 500 according to an embodiment of the present invention. This filter combiner 500 comprises a first port 1 connected to a second port 2 via an inductance L1. The first port 1 is also connected to a third port 3 via an inductance L4. The third port 3 is connected to a fourth port 4 via an inductance L3. The filter combiner also comprises two capacitors C1-C8 for each inductance L1-L4, wherein each inductance is provided a capacitor connected to a ground node at its input and output, respectively.

The filter combiner disclosed in FIG. 6, generally designated 600, differs from the filter combiner 500 in FIG. 5 in that the capacitors connected to the same nodes in the circuit are lumped together.

Finally, FIG. 7 discloses a filter combiner 700 in which the first port 1 is connected to the second port 2 via an inductance L1. Furthermore, the first port 1 is connected to a third port 3 via two capacitors C1 and C3 connected in series. The second port 2 is connected to a fourth port 4 via two capacitors C2 and C4 connected in series. The common node between the capacitors C1 and C3 is connected to the common node between the capacitors C2 and C4 via an inductance L2. The third port 3 is connected to the fourth port 4 via an inductance L3. This embodiment of a filter combiner utilizes a small number of components and may be formed in a dense package.

The inventor has realized that by loading a lowpass filter with a varying load the low pass filter may function as a band stop filter for example. This insight may be used in many different circuits for a filter combiner without departing from the inventive idea. The embodiments shown in FIG. 5 to FIG. 7 are only examples of such filter combiners and many more examples may be found.

LIST OF ITEMS filter combiner 301, 500, 600, 700
Doherty amplifier 302
first port 303,1
carrier amplifier 304
second port 305,2
load 306
third port 307,3
peak amplifier 308
fourth port 309,4
output port 310
first network 311
second network 312
third network 313
fourth network 314
first branch 315
input port 316
splitter 317
further first branch 401

The invention claimed is:

1. A Doherty amplifier for telecommunication, comprising:
an input port:
a splitter with an input connected to the input port;
a carrier amplifier with an input connected to an output of the splitter;
a peak amplifier with an input connected to an output of the splitter with a phase delay: and
a filter combiner including:
a first port with an impedance of Z0 configured to be connected to an output of the carrier amplifier;
a second port with an impedance of Z0·r/(1+r) connected to a load;
a third port with an impedance of Z0·r/(1+r) configured to be connected to the peak amplifier, wherein r is a power ratio for the carrier amplifier to the peak amplifier;
a fourth port with an impedance of Z0 connected to an output port of the Doherty amplifier;
wherein the first port is connected to the second port via a first network, wherein the first network is a lowpass filter;
wherein the first port is connected to the third port via a second network, wherein the second network is a lowpass filter which is configured to operate as a band stop filter upon loading the input or the output of the second network with a high impedance when the peak amplifier is off;
wherein the third port is connected to the fourth port via a third network, wherein the third network is a lowpass filter configured to operate as a band stop filter upon loading the input or the output of the second network with a high impedance when the peak amplifier is off;
wherein the fourth port is connected to the second port via a fourth network, wherein the fourth network is a lowpass filter,
wherein the first network, the second network, the third network, and the fourth network only comprises lumped elements, and are π-type, or T-type, low pass filters, and wherein the first network, the second network, the third network, and the fourth network are symmetrical networks,
wherein in said filter combiner either
said first port is connected to said second port via an inductance L1, and the first port is also connected to the third port via an inductance L4, the third port is connected to the fourth port via an inductance L3, the filter combiner also comprises two capacitors C1-C8 for each inductance L1-L4, wherein each inductance is provided a capacitor connected to a ground node at its input and output respectively,
or
said first port is connected to said second port via an inductance L1, the first port is connected to said third port via two capacitors C1 and C3 connected in series, and the second port is connected to said fourth port via two capacitors C2 and C4 connected in series, wherein a first common node between the capacitors C1 and C3 is connected to a second common node between the capacitors C2 and C4 via an inductance L2, and said third port is connected to said fourth port via an inductance L3.

2. The Doherty amplifier according to claim 1, wherein the high impedance is above 500 ohm.

3. The Doherty amplifier according to claim 1, wherein the first network, the second network and the third network form a first branch, and wherein the filter combiner comprises at least one further first branch cascade coupled to the first branch and to the fourth port of the filter combiner and to the second port of the filter combiner via said fourth network.

\* \* \* \* \*